(12) United States Patent
Sang et al.

(10) Patent No.: US 12,324,347 B1
(45) Date of Patent: Jun. 3, 2025

(54) SYSTEM FOR PRINTING AND DISCHARGING OF FLEXIBLE SEMICONDUCTOR 3D ADDITIVE MATERIAL AND CONTROL METHOD THEREOF

(71) Applicant: TAIYUAN UNIVERSITY OF TECHNOLOGY, Shanxi (CN)

(72) Inventors: Shengbo Sang, Taiyuan (CN); Fan Zhang, Taiyuan (CN); Jianlong Ji, Taiyuan (CN); Xiaojie Chai, Taiyuan (CN)

(73) Assignee: TAIYUAN UNIVERSITY OF TECHNOLOGY, Taiyuan (CN)

( * ) Notice: Subject to any disclaimer, the term of this patent is extended or adjusted under 35 U.S.C. 154(b) by 0 days.

(21) Appl. No.: 19/012,916

(22) Filed: Jan. 8, 2025

(30) Foreign Application Priority Data

Jan. 31, 2024 (CN) .......................... 202410131403.3

(51) Int. Cl.
*H10K 71/13* (2023.01)
*B33Y 10/00* (2015.01)
(Continued)

(52) U.S. Cl.
CPC ............ *H10K 71/135* (2023.02); *B33Y 10/00* (2014.12); *B33Y 40/10* (2020.01); *B33Y 50/02* (2014.12); *B33Y 80/00* (2014.12)

(58) Field of Classification Search
CPC ...... H10K 71/10; H10K 71/12; H10K 71/125; H10K 71/13; H10K 71/135; B33Y 10/00;
(Continued)

(56) References Cited

U.S. PATENT DOCUMENTS

| 10,254,499 B1 | 4/2019 | Cohen et al. | |
|---|---|---|---|
| 2014/0048970 A1* | 2/2014 | Batchelder | ............ B29C 64/106 264/129 |

(Continued)

FOREIGN PATENT DOCUMENTS

| CN | 106738896 A | 5/2017 |
|---|---|---|
| CN | 110901068 A | 3/2020 |

(Continued)

OTHER PUBLICATIONS

First Office Action in Chinese Application No. 202410131403.3 mailed on Sep. 29, 2024, 15 pages.
(Continued)

*Primary Examiner* — Jamel M Nelson
(74) *Attorney, Agent, or Firm* — Porus IP LLC

(57) ABSTRACT

The embodiments of the present disclosure relate to the technical field of a flexible semiconductor 3D additive material, in particular to a system for printing and discharging of a flexible semiconductor 3D additive material and a control method thereof. Ink materials corresponding to different layers of a flexible semiconductor to be printed are pre-treated prior to entering troughs. The ink materials after the pretreatment flow into the multi-channel troughs, the corresponding ink materials are controlled to be sequentially extruded by gases in the corresponding troughs, intertwined and injected into interfaces, and stacked to form a stacked layer structure at end of printheads connected with the interfaces to complete discharging and printing, thereby realizing simultaneous printing of the ink materials of different viscosities and fluidities, improving the printing speed, and realizing direct printing of a sandwich structure of a semiconductor device.

9 Claims, 3 Drawing Sheets

(51) Int. Cl.
*B33Y 40/10* (2020.01)
*B33Y 50/02* (2015.01)
*B33Y 80/00* (2015.01)

(58) Field of Classification Search
CPC ......... B33Y 30/00; B33Y 40/10; B33Y 50/02; B33Y 80/00; B29C 64/10; B29C 64/106; B29C 64/112; B29C 64/188; B29C 64/194; B29C 64/209; B29C 64/393
See application file for complete search history.

(56) References Cited

U.S. PATENT DOCUMENTS

| | | |
|---|---|---|
| 2020/0335303 A1 | 10/2020 | Gandhiraman et al. |
| 2020/0406542 A1 | 12/2020 | Bennett |
| 2021/0154910 A1 | 5/2021 | Cheng et al. |
| 2023/0226760 A1 | 7/2023 | Lan et al. |
| 2025/0050585 A1* | 2/2025 | Epstein ................. B29C 64/393 |

FOREIGN PATENT DOCUMENTS

| | | |
|---|---|---|
| WO | 2019068070 A1 | 4/2019 |
| WO | 2019144897 A1 | 8/2019 |

OTHER PUBLICATIONS

Notification to Grant Patent Right for Invention in Chinese Application No. 202410131403.3 mailed on Oct. 21, 2024, 4 pages.

* cited by examiner

100

A plurality of ink materials entering corresponding pretreatment chambers for pretreatment of temperature, humidity, light, and gas environment modulation in the pretreatment chambers ~ 110

The plurality of ink materials after the pretreatment flowing into corresponding troughs from the pretreatment chambers, and setting an applied gas pressure and an applied gas duration for each trough based on the ink materials required for printing a flexible semiconductor and a thickness of each of the ink materials, the pressure being provided by a pump ~ 120

Controlling, based on material types, printing thicknesses, and a layer sequence of different layer structures of the flexible semiconductor at a position to be printed, the corresponding ink materials to be sequentially extruded by gases in the corresponding troughs, intertwined and injected into interfaces, stacked to form a stacked layer structure at the interfaces, and printed by printheads connected with the interfaces ~ 130

FIG. 1

SYSTEM FOR PRINTING AND DISCHARGING OF FLEXIBLE SEMICONDUCTOR 3D ADDITIVE MATERIAL AND CONTROL METHOD THEREOF

CROSS-REFERENCE TO RELATED APPLICATIONS

This application claims priority to Chinese Patent Application No. 202410131403.3, filed on Jan. 31, 2024, entitled "A system for printing and discharging of a flexible semiconductor 3D additive material and a control method thereof", the entire contents of which are incorporated herein by reference.

TECHNICAL FIELD

The present disclosure relates to the technical field of flexible semiconductor 3D additive materials, and in particular to a system for printing and discharging of a flexible semiconductor 3D additive material and a control method thereof.

BACKGROUND

As a special type of electronic material, the flexible semiconductor has deformation properties such as bendability, foldability, and stretchability, and is usually prepared based on organic polymer materials and used to manufacture flexible electronic devices. Traditional semiconductor manufacturing processes are usually based on rigid substrates, making it difficult to manufacture flexible semiconductor devices with complex shapes and structures.

Additive manufacturing technology, commonly referred to as 3D printing, provides a new solution for manufacturing of flexible semiconductors. Objects can be constructed by stacking multiple layers of materials through 3D printing, realizing manufacturing of customized products and complex geometries. Compared with the traditional subtractive manufacturing technique, additive manufacturing can reduce the waste of materials.

The flexible organic semiconductor device is mainly composed of a flexible substrate, an electrode, an active layer, an insulating layer, and a dielectric layer. The substrate material of the flexible semiconductor is usually a carbon-based compound with flexibility, and the ink material used is generally viscous. The electrode usually requires excellent electrical conductivity, stability, and mechanical flexibility, and the ink material used is generally viscous. The active layer is configured to control a channel of an electron flow and is usually composed of an organic semiconductor material, and the ink material used is generally sparse. The dielectric layer is usually configured to provide doped cations, and the ink material used is generally viscous. The insulating layer uses a flexible organic material or a polymer as a packaging material to ensure the stability and durability of the flexible semiconductor, and the ink material used is generally viscous.

There are some problems in the technical field of 3D printing for the flexible semiconductors. The existing printing equipment often has a single printing mode. Since the ink materials are complex and diverse, and the viscosity is different, it is difficult to meet the simultaneous printing of a plurality of semiconductor ink materials using the same printing mode. The existing printing equipment has only one channel for printing at a time, and the printing speed is relatively slow. In addition, after one material is printed, when the trough is changed to print the next material, the first material is cured, and the interlayer bonding of the two materials is poor. The existing printing equipment only has a temperature control part, while various semiconductor materials have their own unique environmental requirements, which usually makes the printing effect not as expected in printing.

SUMMARY

One or more embodiments of the present disclosure provide a control method for printing and discharging of a flexible semiconductor 3D additive material, applied to printing of the flexible semiconductor 3D additive material. The control method may comprise: a plurality of ink materials entering corresponding pretreatment chambers for pretreatment of temperature, humidity, light, and gas environment modulation in the pretreatment chambers; the plurality of ink materials after the pretreatment flowing into corresponding troughs from the pretreatment chambers, and setting an applied gas pressure and an applied gas duration for each trough based on the ink materials required for printing a flexible semiconductor and a thickness of each of the ink materials, the pressure being provided by a pump; controlling, based on material types, printing thicknesses, and a layer sequence of different layer structures of the flexible semiconductor at a position to be printed, the corresponding ink materials to be sequentially extruded by gases in the corresponding troughs, intertwined and injected into interfaces, stacked to form a stacked layer structure at the interfaces, and printed by printheads connected with the interfaces; a relationship between the printing thickness of each of the ink materials in the flexible semiconductor and the applied gas pressure and the applied gas duration being as follows:

$$D^2 \times th_1 = (\pi \times D^4) \times t_1 \times d^2/(128 \times \eta \times L) \times (\Delta P/\varepsilon \times K)$$

where D denotes a diameter of each of the printheads, $th_1$ denotes the printing thickness, $t_1$ denotes the applied gas duration corresponding to each of the ink materials, d denotes a diameter of each of the interfaces, $\eta$ denotes a viscosity of each of the ink materials, L denotes a length of each of the printheads, $\Delta P$ denotes the applied gas pressure, $\varepsilon$ denotes a porosity of each of the ink materials, and K denotes a permeability of each of the ink materials.

One or more embodiments of the present disclosure provide a system for printing and discharging applied by a control method for printing and discharging of a flexible semiconductor 3D additive material. The system for printing and discharging may comprise a pump, pretreatment chambers, troughs, interfaces, and printheads. The printheads may include a solenoid valve printhead and an electrostatic spinning printhead. One or more troughs may be provided, and upper portions of the one or more troughs may be connected with the pretreatment chambers, respectively. The one or more troughs may be connected with the pump. Ends of part of the one or more troughs may be connected with the solenoid valve printhead through one of the interfaces, and ends of the remaining troughs of the one or more troughs may be connected with the electrostatic spinning printhead through another of the interfaces. The printhead may include the solenoid valve printhead and the electrostatic spinning printhead. Troughs A, B, and C may be connected the solenoid valve printhead for printing an active layer of the flexible semiconductor. Troughs D, E, and F may be connected with the electrostatic spinning printhead for printing an electrode, a dielectric layer, and an insulating layer of the flexible semiconductor, respectively. An opening degree of each proportional valve may be sequentially controlled based on a stacking order of different layers of the flexible semiconductor to be printed. Ink materials in the one or more troughs may be intertwined to flow into the interfaces through conduits disposed at the ends of the one or more troughs, and may be injected into the printheads through the interfaces.

BRIEF DESCRIPTION OF THE DRAWINGS

The present disclosure will be further illustrated by way of exemplary embodiments, which will be described in detail by means of the accompanying drawings. These embodiments are not limiting, and in these embodiments, the same numbering indicates the same structure, wherein:

FIG. 1 is a flowchart illustrating an exemplary control method for printing and discharging of a flexible semiconductor 3D additive material according to some embodiments of the present disclosure;

DETAILED DESCRIPTION

Figure 2:
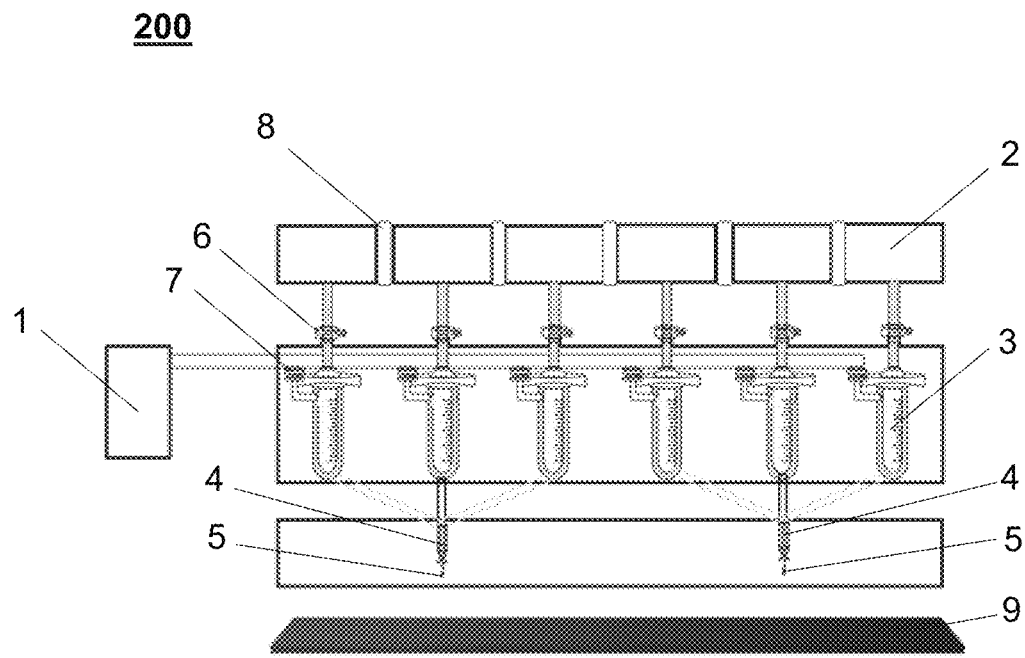
FIG. 2 is a schematic diagram illustrating an exemplary system for printing and discharging of a flexible semiconductor 3D additive material according to some embodiments of the present disclosure.

In order to more clearly illustrate the technical solutions of the embodiments of the present disclosure, the accompanying drawings required to be used in the description of the embodiments are briefly described below. Obviously, the accompanying drawings in the following description are only some examples or embodiments of the present disclosure, and it is possible for a person of ordinary skill in the art to apply the present disclosure to other similar scenarios in accordance with these drawings without creative labor. Unless obviously obtained from the context or the context illustrates otherwise, the same numeral in the drawings refers to the same structure or operation.

It should be understood that the terms "system", "device", "unit" and/or "module" used herein are a way to distinguish between different components, elements, parts, sections, or assemblies at different levels. However, the terms may be replaced by other expressions if other words accomplish the same purpose.

As shown in the present disclosure and in the claims, unless the context clearly suggests an exception, the words "one", "a", "an", "one kind", and/or "the" do not refer specifically to the singular, but may also include the plural. Generally, the terms "including" and "comprising" suggest only the inclusion of clearly identified steps and elements, however, the steps and elements that do not constitute an exclusive list, and the method or apparatus may also include other steps or elements.

Flowcharts are used in the present disclosure to illustrate the operations performed by a system according to embodiments of the present disclosure, and the related descriptions are provided to aid in a better understanding of the magnetic resonance imaging method and/or system. It should be appreciated that the preceding or following operations are not necessarily performed in an exact sequence. Instead, steps can be processed in reverse order or simultaneously. Also, it is possible to add other operations to these processes or to remove a step or steps from these processes.

FIG. 1 is a flowchart illustrating an exemplary control method for printing and discharging of a flexible semiconductor 3D additive material according to some embodiments of the present disclosure. In some embodiments, the control method for printing and discharging of the flexible semiconductor 3D additive material may be applied to a system for printing and discharging of a flexible semiconductor 3D additive material. More descriptions regarding the system for printing and discharging may be found in the related descriptions of FIG. 2, FIG. 3, FIG. 4, and FIG. 5.

FIG. 2 is a schematic diagram illustrating an exemplary system for printing and discharging of a flexible semiconductor 3D additive material according to some embodiments of the present disclosure.

In some embodiments, as shown in FIG. 2, a system 200 for printing and discharging may include: a pump 1, pretreatment chambers 2, troughs 3, interfaces 4, and printheads 5. The printheads 5 may include a solenoid valve printhead and an electrostatic spinning printhead.

One or more troughs 3 may be provided, and upper portions of the one or more troughs 3 may be connected with the pretreatment chambers 2, respectively. The one or more troughs 3 may be connected with the pump 1. Ends of part of one or more troughs 3 may be connected with the solenoid valve printhead through one of the interfaces 4, and ends of the remaining troughs 3 of the one or more troughs 3 may be connected with the electrostatic spinning printhead through another of the interfaces 4. For example, six troughs 3 arranged in sequence are provided in FIG. 2 including, from left to right, a trough A, a trough B, a trough C, a trough D, a trough E, a trough F. The trough A, the trough B, and the trough C connected with the solenoid valve printhead may be configured to print printing an active layer 10 of the flexible semiconductor, and the trough D, the trough E, and the trough F connected with the electrostatic spinning printhead may be configured to print an electrode 11, a dielectric layer 12, and an insulating layer 13 of the flexible semiconductor, respectively.

In some embodiments, a control module may sequentially control an opening degree of each proportional valve 7 according to a stacking sequence of different layers of the flexible semiconductor to be printed. Ink materials in the one or more troughs 3 may be intertwined to flow into the interfaces 4 through conduits disposed at the ends of the one or more troughs 3 and injected into the printheads 5 through the interfaces 4.

The pump is a device that provides a gas pressure to the troughs. In some embodiments, as shown in FIG. 2, the pump 1 may be connected with each of the troughs 3, and the proportional valve 7 may be provided at a connection between an upper end of each of the troughs 3 and the pump 1, such that a flow rate and a pressure of gas provided by the pump 1 for each of the troughs 3 may be controlled by controlling the opening degree of each proportional valve 7.

More descriptions regarding the troughs and the proportional valves may be found in the related descriptions below.

The pretreatment chambers are equipment spaces where the ink materials to be printed are pre-processed. More descriptions regarding the pretreatment may be found in the related descriptions of an operation 110.

Figure 4:
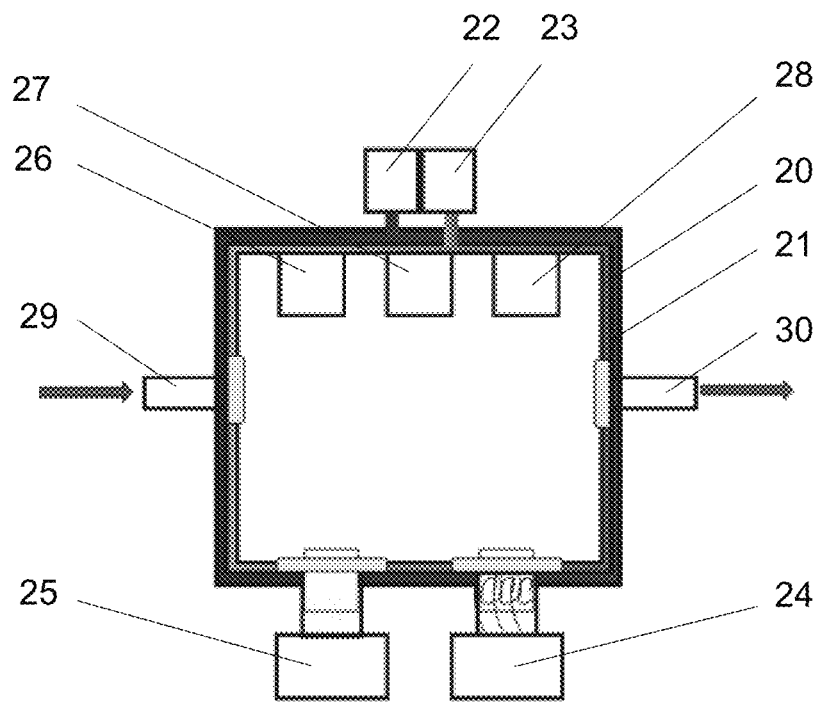
FIG. 4 is a schematic diagram illustrating an exemplary pretreatment chamber according to some embodiments of the present disclosure.

FIG. 4 is a schematic diagram illustrating an exemplary pretreatment chamber according to some embodiments of the present disclosure.

In some embodiments, each of the pretreatment chambers may be provided with a control module, and a temperature module, a humidity module, a light module, and a gas environment module which are electrically connected with the control module. The temperature module may be configured to adjust a temperature of the ink material in each of the pretreatment chambers. The humidity module may be configured to adjust an internal humidity of each of the pretreatment chambers. The light module may be configured to provide different light sources for the pretreatment chambers. The gas environment module may be configured to provide a gas environment for each of the pretreatment chambers.

The control module is a module that is configured to control other modules of each of the pretreatment chambers to operate.

In some embodiments, the control module may be configured as a processor. The processor is a device for executing or processing instructions and/or data related to the control method for printing and discharging of the flexible semiconductor 3D additive material. The processor may execute program instructions based on the data, information, and/or processing results to perform one or more of the functions described in the present disclosure. In some embodiments, the processor may include one or more sub-processing devices (e.g., a single-core processing device or a multi-core processing device). Merely by way of example, the processor may include a central processing unit (CPU), an application-specific integrated circuit (ASIC), or the like, or any combination thereof.

In some embodiments, the temperature module may be disposed inside the pretreatment chamber for adjusting the temperature inside the pretreatment chamber so as to adjust a viscosity and a fluidity of the ink material.

The ink material refers to a material for printing the flexible semiconductor. In some embodiments, the ink material includes, but is not limited to, an organic small molecule semiconductor material, a polymer semiconductor material, a silver ink material, a copper ink material, a carbon nanotube ink material, an aluminum ink material, a liquid electrolyte, a flexible organic material, etc.

The flexible semiconductor is an electronic material that has semiconductor properties. The flexible semiconductor can maintain the electrical properties in case of deformations such as bending, stretching, and folding, and can be used to manufacture flexible electronic devices. For example, the flexible semiconductor may include an organic semiconductor material, an inorganic semiconductor material, flexible silicon, a metal nanowire, etc.

Figure 5:
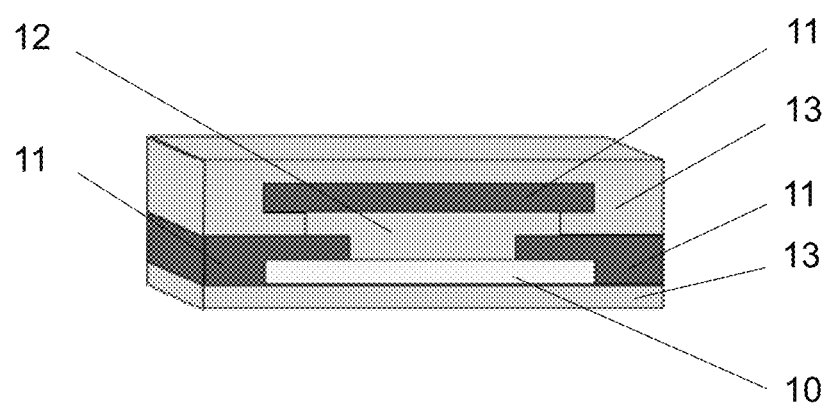
FIG. 5 is a schematic diagram illustrating an exemplary flexible semiconductor to be printed according to some embodiments of the present disclosure.

FIG. 5 is a schematic diagram illustrating an exemplary flexible semiconductor to be printed according to some embodiments of the present disclosure.

In some embodiments, the flexible semiconductor to be printed may include the active layer 10, the electrode 11, the dielectric layer 12, and the insulating layer 13, as shown in FIG. 5.

The active layer 10 is a material layer containing an active device and configured to control a channel of an electron flow. The active layer 10 may be composed of an organic semiconductor material.

The electrode 11 is a material layer that provides power input and output, and may be composed of a material (e.g., sulfide, etc.) having excellent electrical conductivity, stability, and mechanical flexibility.

The dielectric layer 12 is a material layer that isolates and stores electrical energy and is configured to provide doped cations.

The insulating layer 13 is a material layer that provides electrical isolation, and may be composed of a flexible organic material or a polymer to ensure the stability and durability of the flexible semiconductor.

In some embodiments, as shown in FIG. 5, the insulating layer 13 may be disposed at a bottom or a top of the flexible semiconductor to be printed to realize the protection effect. The electrode 11 may include a source electrode, a drain electrode, and a gate electrode. The source electrode and the drain electrode may be disposed on two sides of the active layer 10, and the gate electrode may be separated from the active layer 10 by the dielectric layer 12. The electrode is responsible for transporting charges and electrical signals. The dielectric layer 12 may be disposed between the gate electrode and the active layer 10 to isolate the electrical signals. The active layer 10 may be disposed within or below the electrode 11, such that current may be controlled through the source electrode and the drain electrode.

In some embodiments, as shown in FIG. 4, the temperature module may include a heating device 23, a refrigeration device 22, and a temperature sensor which are disposed inside each of the pretreatment chambers 2 and electrically connected with the control module. The temperature sensor may sense an internal temperature of each of the pretreatment chambers 2 in real time, and transmit temperature data to the control module. The control module may activate the heating device 23 or the refrigeration device 22 according to a temperature property of the ink material to realize real-time temperature modulation.

The temperature sensor is sensing device for monitoring the internal temperature of the pretreatment chamber, such as a thermistor sensor, a thermocouple temperature sensor, etc.

The heating device 23 is a device that provides heat to increase the internal temperature of the pretreatment chamber, such as a heater, etc. In some embodiments, when the temperature sensor monitors that the internal temperature of each of the pretreatment chambers is below a target temperature, the heating device 23 may start to provide a continuous heat source to each of the pretreatment chambers 2, thereby maintaining a temperature environment of each of the pretreatment chambers 2.

The target temperature is an internal temperature that the pretreatment chamber needs to achieve for the ink material to reach a desired viscosity and fluidity for printing. In some embodiments, the target temperature may be set by a skilled person based on experience.

The refrigeration device 22 is a device that absorbs heat to reduce the internal temperature of the pretreatment chamber 2. For example, the refrigeration device may include, but is not limited to, a cooling fan, a heat pipe, and a refrigeration cycle component. In some embodiments, when the internal temperature of each of the pretreatment chambers is greater than the target temperature, the cooling fan may start to blow cold air to the inside of each of the pretreatment chambers 2. A resulting airflow accelerates the dissipation of heat, and an absorption end of the heat pipe absorbs the dissipated heat. The heat may be conducted to a heat dissipation end through evaporation and condensation of a working medium. The heat dissipation end may direct the heat to the outside of each of the pretreatment chambers 2. The refrigeration cycle may take the heat out of the system for printing and discharging from the outside of each of the pretreatment chambers 2 through a refrigeration cycle process.

The temperature property refers to a change in the viscosity and the fluidity of the ink material as affected by temperature. In some embodiments, the temperature property is an inherent property of the ink material, and different ink materials may have different temperature properties. The temperature property may be pre-uploaded to the control module by a skilled person.

More descriptions regarding realizing temperature modulation may be found in the related descriptions of the operation 110.

In some embodiments, the humidity module may be configured to adjust the internal humidity of each of the pretreatment chambers 2. In some embodiments, the humidity module and the temperature module may be configured to adjust the viscosity and the fluidity of the ink material. If each of the ink materials is maintained at the viscosity and the fluidity required for printing, the internal temperature of each of the pretreatment chambers needs to be maintained at the target temperature, and the internal humidity of each of the pretreatment chambers needs to be maintained at a target humidity.

The target humidity is an internal humidity of the pretreatment chamber for the ink material to achieve the desired viscosity and viscosity for printing. In some embodiments, the target humidity may be set by a skilled person based on experience.

In some embodiments, as shown in FIG. 4, the humidity module may include a humidifying device 24, a dehumidifying device 25, and a humidity sensor which are electrically connected with the control module. The humidity sensor may be disposed inside each of the pretreatment chambers 2. The humidifying device 24 and the dehumidifying device 25 may be disposed outside each of the pretreatment chambers 2 and communicated with the inside of each of the pretreatment chambers 2. The humidity sensor may monitor the internal humidity of each of the pretreatment chambers 2 in real time and transmit the internal humidity to the control module. The control module may activate the humidifying device 24 or the dehumidifying device 25 according to a humidity demand of each of the ink materials to realize humidity modulation.

The humidity sensor is a sensing device for monitoring the internal humidity of the pretreatment chamber, such as a capacitive humidity sensor, a resistive humidity sensor, etc.

The humidifying device 24 is a device for humidifying the inside of the pretreatment chamber, such as a humidifier, etc. In some embodiments, when the humidity sensor monitors that the internal humidity of each of the pretreatment chambers is below the target humidity, the control module may activate the humidifying device to humidify the pretreatment chamber. A humidification mode may include increasing the humidity by releasing moisture into the pretreatment chamber through thermal evaporation.

The dehumidifying device 25 is a device for dehumidifying the inside of the pretreatment chamber, such as a dehumidifier, etc. In some embodiments, when the humidity sensor monitors that the internal humidity of each of the pretreatment chambers 2 is greater than the target humidity, the control module may activate the dehumidifying device to dehumidify the pretreatment chamber. A dehumidification mode may include reducing the humidity by bringing moisture out of the pretreatment chamber through compression.

The humidity demand is a humidity required when the ink material is used for printing. In some embodiments, the humidity demand may be pre-uploaded to the control module by a skilled person.

More description regarding realizing humidity modulation may be found in the related descriptions of the operation 110.

In some embodiments, the light module may be disposed inside each of the pretreatment chambers 2 for providing different light sources to the pretreatment chambers 2 to maintain the stable performance of the ink materials in the pretreatment chambers.

In some embodiments, as shown in FIG. 4, the light module may include a visible light lamp 26, an infrared light lamp 27, an ultraviolet light lamp 28, and a light intensity sensor, an infrared light sensor, an ultraviolet light sensor which are disposed inside each of the pretreatment chambers 2 and electrically connected with the control module. The light intensity sensor, the infrared light sensor, and the ultraviolet light sensor may respectively monitor a visible light intensity, an infrared light intensity, and an ultraviolet light intensity in each of the pretreatment chambers 2 in real time, and transmit the visible light intensity, the infrared light intensity, and the ultraviolet light intensity to the control module. The control module may modulate the visible light intensity, the infrared light intensity, and the ultraviolet light intensity according to a photosensitive property demand of each of the ink materials.

In some embodiments, the visible light lamp 26, the infrared light lamp 27, and the ultraviolet light lamp 28 may be configured to provide light at different wavelengths.

The visible light lamp emits visible light and is configured to provide the visible light to the inside of each of the pretreatment chambers such that staff observe the inside of each of the pretreatment chambers and perform visual operation.

The ultraviolet light lamp emits ultraviolet light, and the infrared light lamp emits infrared light. Both ultraviolet light lamp and the infrared light lamp are configured to trigger photosensitive components in the semiconductor ink materials to achieve specific physical and chemical changes.

The light intensity sensor, the infrared light sensor, and the ultraviolet light sensor refer to sensing devices for monitoring the visible light intensity, the infrared light intensity, and the ultraviolet light intensity, respectively. In some embodiments, the light intensity sensor, the infrared light sensor, and the ultraviolet light sensor may transmit monitored visible light intensity data, infrared light intensity data, and ultraviolet light intensity data to the control module. The control module may control the visible light lamp, the infrared light lamp, and the ultraviolet light lamp to adjust the corresponding visible light intensity, the infrared light intensity, and the ultraviolet light intensity, respectively according to the photosensitive property demand of each of the ink materials.

The photosensitive property demand refers to a reaction feature of the ink material to light, such as a light sensitivity, a reaction speed, a curing efficiency, etc. The ink material undergoes a chemical reaction when exposed to a particular wavelength of light, which cures or alters the form of the ink material. The photosensitive property demand of the ink material is a property of the ink material (e.g., a photosensitive resin undergoes a polymerization reaction to change from a liquid state to a solid state under the irradiation of the ultraviolet light lamp), which may be pre-uploaded to the control module by a skilled person.

More descriptions regarding realizing light intensity modulation may be found in the related descriptions of the operation 110.

In some embodiments, the gas environment module may be configured to adjust a gas environment inside the pretreatment chamber to prevent oxidation of the ink material.

The gas environment refers to an environment formed by gases inside the pretreatment chamber. For example, the gas environment is characterized by gas types and corresponding gas concentrations. The gas types may mainly include oxygen and inert gases.

In some embodiments, as shown in FIG. 4, the gas environment module may include a gas inlet 29, a gas outlet 30, an oxygen content sensor, and an inert gas sensor. The gas inlet 29 and the gas outlet 30 may be disposed on left and right sides of a top of each of the pretreatment chambers 2, respectively. The oxygen content sensor and the inert gas sensor may be disposed inside each of the pretreatment chambers 2 and electrically connected with the control module. The oxygen content sensor and the inert gas sensor may monitor an oxygen concentration and an inert gas concentration in each of the pretreatment chambers 2 in real time, and transmit the oxygen concentration and the inert gas concentration to the control module. The control module may control a type and a flow rate of an introduced gas by opening or closing at least one of the gas inlet 29 or the gas outlet 30 according to a gas concentration required by each of the ink materials to control the gas environment.

In some embodiments, the gas inlet 29 may be configured to introduce an external gas to each of the pretreatment chambers 2.

In some embodiments, the gas outlet 30 may be configured discharge the gases out of each of the pretreatment chambers 2.

The oxygen content sensor refers to a device for monitoring an oxygen content inside the pretreatment chamber.

The inert gas sensor is a device for monitoring an inert gas content inside the pretreatment chamber.

The gas concentration required by each of the ink materials refers to a gas concentration that needs to be maintained inside the pretreatment chamber to ensure that the ink material is not oxidized, such as an oxygen concentration of 20% and an inert gas concentration of 80%.

More descriptions regarding realizing gas environment modulation may be found in the related descriptions of the operation 110.

In some embodiments, as shown in FIG. 4, a wall of each of the pretreatment chambers 2 may be composed of inner and outer layers through bonding. An inner layer 20 may include plastics, and an outer layer 21 may include a metal film.

In some embodiments, as shown in FIG. 4, the inner layer of the wall of each of the pretreatment chambers 2 may be mechanically connected with the heating device 23, and the outer layer of the wall of each of the pretreatment chambers 2 may be mechanically connected with the refrigeration device 22.

In some embodiments, the plastics in the inner layer of the wall of each of the pretreatment chambers may have an insulated and closed structure and may adopt insulating plastics to prevent the influence of the outside temperature on the printing process, reduce dissipation of the heat, and provide a more stable temperature environment. The plastics in the inner layer may be made of polystyrene, polyurethane, polypropylene, polyethylene, etc.

The metal film may be used as the outer layer of the wall of each of the pretreatment chambers for improving the electrical and thermal conductivity of the pretreatment chamber, which is conducive to the rapid transfer of current and heat during the printing process, thereby improving the stability and accuracy of printing.

In some embodiments, heat insulation of the pretreatment chambers 2 may be realized by a synthetic stone 8, as shown in FIG. 2.

The synthetic stone is a stone made of natural stone powder with a small amount of polyester and adhesive by synthesis. The synthetic stone may be disposed between two adjacent pretreatment chambers to provide thermal insulation.

In some embodiments, an ink reservoir may be disposed in each of the pretreatment chambers. The ink reservoir may be made of a transparent material and mechanically connected with the temperature module. A temperature adjustment medium may be disposed in each of the pretreatment chambers. The temperature module may be configured to adjust a temperature of the temperature adjustment medium to indirectly adjust a temperature of the ink inside the ink reservoir. The inside of the ink reservoir may be connected with the humidity module and the gas environment module set inside each of the pretreatment chambers.

The ink reservoir is a container for storing the ink material. In some embodiments, the ink reservoir may be made of the transparent material to ensure that the light module provides effective light to the ink material.

In some embodiments, the ink reservoir may be mechanically connected with the temperature module. For example, a strut may be disposed above or below the ink reservoir. One end of the strut may be connected with the ink reservoir, and the other end of the strut may be connected with the wall of each of the pretreatment chambers. The ink reservoir may be connected with the wall of each of the pretreatment chambers through the strut, and the wall of each of the pretreatment chambers may be mechanically connected with the temperature module, thereby realizing mechanical connection between the ink reservoir and the temperature module.

The temperature adjustment medium is a medium that has a temperature adjustment function. The temperature adjustment medium may be provided between the inner layer of the wall of each of the pretreatment chambers and an outer wall of the ink reservoir. The temperature module may adjust the temperature of the temperature adjustment medium to indirectly adjust the temperature of the ink in the ink reservoir.

In some embodiments, the temperature adjustment medium may adopt a material with a relatively large specific heat capacity (e.g., water), such that a change rate of the temperature of the ink adjusted by the temperature module is not too fast through the temperature adjustment medium with strong heat absorption and heat dissipation, thereby maintaining printing stability.

In some embodiments, the humidity module and the gas environment module may be connected with the inside of the ink reservoir through a pipeline. For example, the humidifying device and the dehumidifying device may be connected with the inside of the ink reservoir through a pipeline. As another example, the inside of the ink reservoir may be connected with a cavity (a cavity between the inner layer of each of the pretreatment chambers and the outer wall of the ink reservoir) within each of the pretreatment chambers through a pipeline.

The ink reservoir made of the transparent material is disposed inside each of the pretreatment chambers, the ink reservoir is mechanically connected with the temperature module, the inside of the ink reservoir is connected with the humidity module and the gas environment module, and the temperature adjustment medium with a relatively large specific heat capacity is disposed between the inner layer of the wall of each of the pretreatment chambers and the outer wall of the ink reservoir, which effectively avoids an excessive fluctuation in the temperature of the ink, maintains the stability of the temperature of the ink, and prevent volatilization of the ink to produce toxic and hazardous gases to be released into the air.

The trough refers to a container for squeezing the ink material into the printhead. In some embodiments, as shown in FIG. 2, the one or more troughs 3 may be provided, and the upper portions of the one or more troughs 3 may be connected with the pretreatment chambers 2, respectively. A check valve 6 may be provided on the conduit connecting each of the one or more troughs 3 and each of the pretreatment chambers 2 of the semiconductor ink materials. The one or more troughs 3 may be connected with the pump 1. The proportional valve 7 may be provided at a position of an upper end of each of the one or more troughs 3 connected with the pump 1. The ends of the one or more troughs 3 may be connected with the printheads 5 through the interfaces 4.

In some embodiments, the troughs connected with a solenoid valve printhead may be configured to print an active layer of the flexible semiconductor, and the troughs connected with an electrostatic spinning printhead may be configured to print an electrode, a dielectric layer, and an insulating layer of the flexible semiconductor. For example, the ink materials in the trough A, the trough B, and the trough C may be indium tin oxide, or other organic small molecule semiconductor materials or polymer semiconductor materials for printing the active layer of the flexible semiconductor. The ink material in the trough D may be a silver ink material, a copper ink material, a carbon nanotube ink material, an aluminum ink material, and other ink materials for printing the electrode of the semiconductor. The ink material in the trough E may be a liquid electrolyte for printing the dielectric layer of the semiconductor. The ink material in the trough E may be a flexible organic material, such as dimethylsiloxane, for printing the insulating layer of the semiconductor.

More descriptions regarding the interfaces 4 and the printheads 5 may be found in the related descriptions below.

The check valve 6 refers to a valve that controls unidirectional flowing of an object. In some embodiments, the check valve may control the unidirectional flowing of the ink materials from the pretreatment chambers 2 to the troughs, and flowing and blocking of the ink materials by controlling opening and closing of the check valve.

The proportional valve 7 is a valve that controls a gas flow rate. In some embodiments, by controlling an opening degree of each proportional valve, a flow rate and a speed of the gas from the pump into the troughs may be controlled. The larger the opening degree of each proportional valve, the greater the flow rate and the speed of the gas provided by the pump to the troughs. A count of the proportional valves may be the same as a count of the troughs.

The opening degree of each proportional valve refers to a degree of opening of the proportional valve. The opening degree may be expressed as a percentage from 0% to 100%.

In some embodiments, a pressure sensor and an ink height monitoring component may be provided inside each of the troughs 3.

The pressure sensor is a sensing device configured to monitor an applied gas pressure in the trough, such as a gauge pressure sensor, a differential pressure sensor, an absolute pressure sensor, etc. The applied gas pressure refers to the pressure of an extrusion gas provided by the pump.

The extrusion gas refers a gas that is used to extrude the ink materials from the troughs into the printheads. In some embodiments, the extrusion gas may be a filtered inert gas. In some embodiments, the extrusion gas may enter the troughs through the pump, and the ink materials in the troughs may be extruded by the extrusion gas to enter the printheads.

The ink height monitoring component refers to a component that detects an ink height inside each of the troughs, such as an ultrasonic sensor, a laser sensor, etc. In some embodiments, the ink height monitoring component may be disposed at a top end inside each of the troughs and configured to measure a distance from the top end to a liquid surface of each of the ink materials, so as to determine a difference between a height of the trough and the distance as the ink height.

In some embodiments, the pressure sensor and the ink height monitoring component may be electrically connected with the control module to transmit data of the monitored applied gas pressure and the ink height inside the trough to the control module.

In some embodiments, when the pressure sensor inside each of the troughs monitors a sudden change in the magnitude of the applied gas pressure inside the trough and/or the ink height monitoring component monitors that the ink height inside the trough is 0, the control module may determine that the ink material inside the trough is emptied, etc. The control module may control the proportional valve to close, so as to prevent the extrusion gas from impacting a printed material through the printhead to cause deformation.

In some embodiments of the present disclosure, by providing the pressure sensor and the ink height monitoring component, the applied gas pressure and the ink height inside each of the troughs can be monitored in real time, which facilitates timely response to the sudden change in the pressure of the extrusion gas, and prevent the equipment or materials from being damaged by the impacting of the extrusion gas.

In some embodiments, a trough temperature sensor and a heating element may be provided inside each of the troughs. A refrigeration element may be provided outside each of the troughs. The trough temperature sensor, the heating element, and the refrigeration element may be electrically connected with the control module. The trough temperature sensor may be configured to sense a temperature of each of the troughs. When a required printing temperature of each of ink materials is greater than the room temperature, the heating element may heat each of the troughs. When the required printing temperature of each of the ink materials is less than the room temperature, the refrigeration element may cool each of the troughs.

The trough temperature sensor refers to a sensing device for monitoring an internal temperature of the trough. The trough temperature sensor may be electrically connected with the control module. The trough temperature sensor may transmit detected temperature data to the control module. The control module may control the internal temperature of the trough according to the temperature data.

The heating element refers to an element for heating the trough, such as a thermocouple wire, etc. When the required printing temperature of each of the ink materials is greater than the internal temperature of the trough, the heating element may start to operate to warm up the trough.

The refrigeration element refers to an element for cooling the trough, such as a semiconductor refrigeration plate, etc. When the required printing temperature of each of the ink materials is lower than the internal temperature of the trough, the refrigeration element may start to operate to cool the trough.

Figure 3:
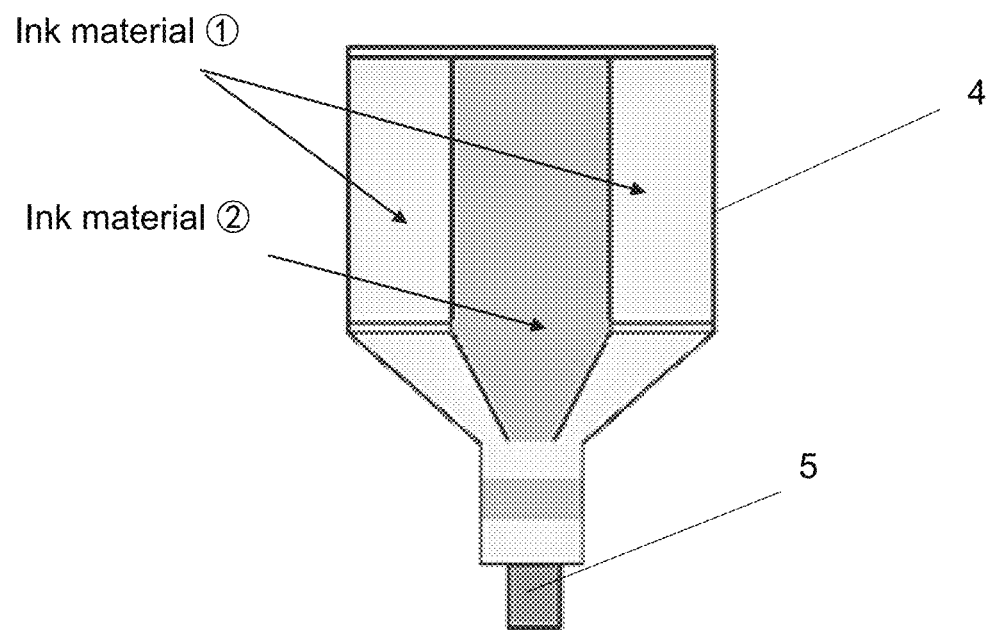
FIG. 3 is a schematic diagram illustrating an exemplary connection of an interface and a printhead according to some embodiments of the present disclosure.

FIG. 3 is a schematic diagram illustrating an exemplary connection of an interface and a printhead according to some embodiments of the present disclosure.

The interface is a connector used to connect a trough to a printhead.

The printhead is an outlet of ink materials for stacking the ink materials into a 3D additive material. In some embodiments, a diameter of each of the printheads 5 may be within a range of 0.1-0.5 cm.

In some embodiments, an end of each of the troughs 3 may be connected with each of the printheads 5 through one of the interfaces 4, as shown in FIG. 3.

In some embodiments, a solenoid valve printhead controls flowing of a fluid through an electromagnetic force and includes a coil, a valve body, and a spool. When current passes through the coil, a generated magnetic field causes the spool to be attracted or pushed, thus opening or closing the valve body, controlling flowing or blocking of the ink materials, and ejecting the ink materials onto a surface of the heated bed to form a desired layered structure of a flexible semiconductor. A structure and a design of the solenoid valve printhead (e.g., a shape of a nozzle, a size of an aperture, an ejection angle, etc.) may be customized to meet the specific requirements of application.

In some embodiments, an electrostatic spinning printhead may be connected to a high voltage power supply through a high voltage wire. If a voltage of 1600V-1800V is applied, the electrostatic spinning printhead may print a finer effect of the ink materials. The high voltage power supply and the heating bed may form a common ground connection. When the voltage is applied, the ink materials carry electric charges. Due to the high voltage effect at the orifice of a spinning nozzle, the ink materials build up and stretch to form fine filaments by an electrostatic force to be ejected from the printhead to the heating bed below and cured to form the printed flexible semiconductor.

In some embodiments, a printhead temperature sensor may be provided inside each of the printheads and electrically connected with a control module to provide real-time feedback on a printhead temperature.

In some embodiments, the control module may control the temperature of each of the ink materials in the printheads in real time according to different ink materials, so as to prevent the ink materials at the printheads from being cured during the printing process to form the filaments due to a decrease in the temperature, thereby avoiding affecting the printing resolution.

In some embodiments, as shown in FIG. 2, a heating bed 9 may be provided below the printheads 5. The heating bed 9 may serve as a printing platform capable of providing a stable heat source to accelerate solidification and bonding of the ink materials while keeping the printed flexible semiconductor flat.

In some embodiments of the present disclosure, by providing the pretreatment chambers, the ink materials may be pretreated before entering the troughs. The control module may adjust an environmental parameter of each of the pretreatment chambers through feedback from a plurality of modules, including the temperature, the humidity, the light intensity, and the gas environment, such that different ink materials are in the optimal printing state to achieve the optimal printing effect. The simultaneous printing of the ink materials of different viscosities and fluidities is realized by providing a plurality of multi-channel troughs and controlling the applied gas pressure and the applied gas duration, which improves the printing speed and shortens the printing time. By providing the solenoid valve printhead and the electrostatic spinning printhead, the ink materials can be intertwined and injected into the solenoid valve printhead or the electrostatic spinning printhead, and stacked to form a stacked material structure at the ends of the printheads, which can realize direct printing of the sandwich structure of the semiconductor device, and complete integrated printing of the packaging and the device.

As shown in FIG. 1, the process 100 may include the following operations. In some embodiments, the process 100 may be performed by the system for printing and discharging of the flexible semiconductor 3D additive material. For example, the process 100 may be executed by a processor in the control module.

In some embodiments, the control method for printing and discharging of the flexible semiconductor 3D additive material may include: the plurality of ink materials entering the corresponding pretreatment chambers for pretreatment of temperature, humidity, light, and gas environment modulation in the pretreatment chambers; the plurality of ink materials after the pretreatment flowing into the corresponding troughs from the pretreatment chambers, and setting an applied gas pressure and an applied gas duration for each trough based on the ink materials required for printing a flexible semiconductor and a thickness of each of the ink materials, the pressure being provided by a pump; controlling, based on material types, printing thicknesses, and a layer sequence of different layer structures of the flexible semiconductor at a position to be printed, the corresponding ink materials to be sequentially extruded by gases in the corresponding troughs, intertwined and injected into interfaces, stacked to form a stacked layer structure at the interfaces, and printed by the printheads connected with the interfaces.

In 110, a plurality of ink materials may enter corresponding pretreatment chambers for pretreatment of temperature, humidity, light, and gas environment modulation in the pretreatment chambers.

In some embodiments, the plurality of ink materials may enter the corresponding pretreatment chambers, and the processor may perform pretreatment on the ink materials in the pretreatment chambers based on a first preset program. The pretreatment may include temperature modulation, humidity modulation, light modulation, and gas environment modulation.

The first preset program is a program for performing the pretreatment on the ink materials in the pretreatment chambers. The first preset program may be pre-stored in the processor.

In some embodiments, the processor may perform the temperature modulation on the ink materials in the pretreatment chambers based on the first preset program.

In some embodiments, the first preset program may include: for each of the ink materials, determining, based on ink material data and an ambient temperature, a candidate target temperature of each of the pretreatment chambers; and determining a target temperature of each of the pretreatment chambers by adjusting the candidate target temperature.

The ink material data is data related to materials of the ink materials, such as a curing temperature of each of the ink materials. In some embodiments, the ink material data may be pre-uploaded to the control module by those skilled in the art.

The ambient temperature is a temperature of an environment in which the system for printing and discharging is located.

The candidate target temperature is a preliminary determined candidate value for the target temperature. More descriptions regarding the target temperature may be found in the related descriptions of FIG. 4.

In some embodiments, the processor may determine the target temperature of each of the pretreatment chambers corresponding to each of the ink materials based on the ink material data of the ink materials, the ambient temperature according to a first vector database.

In some embodiments, the first vector database may include a plurality of first feature vectors and first labels corresponding to the first feature vectors. The first feature vectors may be constructed from sample ink material data of sample ink materials and sample ambient temperatures. The first labels corresponding to the first feature vectors may include sample target temperatures of sample pretreatment chambers corresponding to the sample ink materials.

The first vector database may be constructed based on historical data. The processor may construct the first feature vectors based on historical ink material data of historical ink materials and historical ambient temperatures in the historical data. For one of the first feature vectors, a historical target temperature with the optimal printing effect among a plurality of historical prints corresponding to the first feature vector may be determined through manual evaluation, and the historical target temperature with the optimal printing effect may be labeled as a first label corresponding to the first feature vector. The optimal printing effect refers to the printed flexible semiconductor having the optimal fusion at a junction of different ink materials.

In some embodiments, the processor may construct a first target vector based on ink material data of a current printing ink material and the ambient temperature, determine, by searching in the first vector database, one or more first feature vectors of which first similarities with the first target vector are greater than a preset similarity threshold, and calculate a mean value of first labels corresponding to the one or more first feature vectors to determine a target temperature corresponding to the first target vector.

In some embodiments, when the ink materials enter the corresponding pretreatment chambers, the control module may control a temperature module to heat or cool each of the pretreatment chambers to reach a target temperature corresponding to each of the pretreatment chamber.

In some embodiments, for each of the ink materials, the processor may determine an extrusion speed of the ink material based on an applied gas pressure and the ink material data corresponding to the ink material; and adjust, based on the extrusion speed, the candidate target temperature to determine the target temperature.

More descriptions regarding the applied gas pressure may be found in the related descriptions of FIG. 2.

More descriptions regarding obtaining the applied gas pressure corresponding to the ink materials may be found in the related descriptions below.

The extrusion speed refers to a speed at which the ink materials are extruded by gases in the corresponding troughs. The extrusion speed may be expressed by a volume of the ink material extruded per unit time.

In some embodiments, the processor may determine the extrusion speed based on the applied gas pressure and the ink material data through a Poiseuille flow model. The Poiseuille flow model may be represented by the following equation:

$$\Delta P = \frac{8\mu H Q}{\pi r^4}$$

where r denotes a radius of an extrusion aperture of the trough, H denotes a drop of an ink height in the trough determined from an ink demand, Q denotes the extrusion speed at which the ink material is extruded from the trough, $\Delta P$ denotes the applied gas pressure in the trough, and $\mu$ denotes a viscosity of the ink material. More descriptions regarding the applied gas pressure may be found in the related descriptions below.

In some embodiments, in response to determining that the extrusion speed is less than a second preset threshold, the processor may increase the candidate target temperature by a preset temperature adjustment to determine the target temperature.

The second preset threshold refers to a critical extrusion speed at which curing of the ink material occurs during extrusion. In some embodiments, the second preset threshold may be related to a difference between a curing temperature of the ink material and the candidate target temperature. The greater the difference between the candidate target temperature and the curing temperature of the ink material, the lower the possibility that curing of the ink material occurs during extrusion, and the smaller the second preset threshold, so as to set a smaller extrusion speed to avoid ink solidification while maximizing the printing quality.

In some embodiments, the preset temperature adjustment and the second preset threshold may be set by those skilled in the art based on experience.

In some embodiments of the present disclosure, the extrusion speed of the ink material can be accurately determined based on the applied gas pressure and the ink material data corresponding to the ink material, and then the candidate target temperature can be reasonably adjusted based on the extrusion speed to determine the target temperature, so as to prevent the ink material from curing during the printing process and improve the printing quality.

In some embodiments, for each of the ink materials, the processor may determine the target temperature by adjusting the candidate target temperature based on the ink material data and a temperature and an introduction flow rate of an inert gas introduced into each of the pretreatment chambers.

The inert gas introduced into each of the pretreatment chambers refers to a gas that does not easily react with other substances and is introduced into the pretreatment chamber to prevent oxidation of the ink material inside the pretreatment chamber, such as helium, neon, argon, etc.

The introduction flow rate refers to a flow rate of the inert gas introduced into the pretreatment chamber. The introduction flow rate may be expressed by a volume of the inert gas introduced per unit time.

In some embodiments, for each of the ink materials, the processor may obtain a temperature fluctuation value of the inert gas to the ink material based on the ink material data and the temperature and the introduction flow rate of the inert gas through clustering analysis; and adjust the candidate target temperature based on the temperature fluctuation value to determine the target temperature.

The temperature fluctuation value refers to a value of temperature fluctuation of the ink material due to introduction of the inert gas. The temperature fluctuation value may be expressed by a difference between a temperature of the ink material after the inert gas is introduced and a temperature of the ink material before the inert gas is introduced. The temperature fluctuation value may be expressed as a positive value or a negative value.

In some embodiments, objects to be clustered for cluster analysis may include a plurality of clustering feature vectors and a clustering target vector. Each of the clustering feature vectors may include the temperature and the introduction flow rate of the inert gas, the ink material data of the ink materials, and the temperature fluctuation value. The clustering feature vectors may be constructed based on the historical data.

For example, the clustering feature vectors may be constructed from historical temperatures and historical introduction flow rates of historical inert gases, historical ink material data of historical ink materials, and historical temperature fluctuation values of the historical ink materials in the historical prints. The clustering target vector may be constructed from a current temperature and a current introduction flow rate of a current inert gas, and current ink material data of a current ink material.

In some embodiments, clustering indexes for cluster analysis may include the temperature and the introduction flow rate of the inert gas, and the ink material data of the ink materials.

In some embodiments, the processor may cluster the objects to be clustered based on the clustering indexes to obtain a plurality of clusters; select a cluster that contains the clustering target vector from the plurality of clusters, and mark the cluster as a target cluster; and determine a mean value of temperature fluctuation values in all clustering feature vectors in the target cluster as the temperature fluctuation value corresponding to the clustering target vector.

In some embodiments, the manner of the cluster analysis may include K-mean clustering, mean drift clustering, etc.

In some embodiments, the processor may determine the target temperature by adjusting the candidate target temperature of the ink material by the temperature fluctuation value.

In some embodiments of the present disclosure, the fluctuation value caused by the inert gas on the temperature of the ink material can be accurately evaluated based on the ink material data and the temperature and the introduction flow rate of the inert gas introduced into the pretreatment chambers, and then the candidate target temperature is adjusted based on the temperature fluctuation value, thereby excluding the influence of the inert gas on the target temperature, and obtaining a more accurate target temperature.

In some embodiments of the present disclosure, the target temperature of each of the pretreatment chambers can be accurately determined based on the ink material data of each of the ink materials and the ambient temperature, such that the differences in the ink material data of the ink materials and the influence of the ambient temperature of the pretreatment chambers on the ink materials are fully considered, thereby obtaining the more accurate target temperature.

In some embodiments, the processor may perform the humidity modulation on each of the ink materials in each of the pretreatment chambers based on the first preset program.

In some embodiments, the first preset program may further include: for each of the ink materials, determining, based on the ink material data and an ambient humidity, a target humidity when the ink material is in the pretreatment chamber.

The ambient humidity is a humidity of an environment in which the system for printing and discharging is located. More descriptions regarding the target humidity may be found in the related descriptions of FIG. 4.

In some embodiments, the processor may determine the target humidity in each of the pretreatment chambers corresponding to each of the ink materials based on the ink material data and the ambient humidity according to a second vector database.

In some embodiments, the second vector database may include a plurality of second feature vectors and second labels corresponding to the second feature vectors.

The second feature vectors may be constructed from sample ink material data of sample ink materials and sample ambient humidities. The second labels corresponding to the second feature vectors may include actual target humidities of the sample pretreatment chambers corresponding to the sample ink materials.

The second vector database may be constructed based on the historical data. The processor may construct the second feature vectors based on historical ink material data of historical ink materials, and historical ambient humidities in the historical data. For one of the second feature vectors, a historical target humidity with the optimal printing effect among a plurality of historical prints corresponding to the second feature vector may be determined through manual evaluation, and the historical target humidity with the optimal printing effect may be labeled as a second label corresponding to the second feature vector.

In some embodiments, the processor may construct a second target vector based on ink material data of a current printing ink material and the ambient humidity, determine, by searching in the second vector database, one or more second feature vectors of which second similarities with the second target vector are greater than a preset similarity threshold, and calculate a mean value of second labels corresponding to the one or more first feature vectors to determine a target humidity corresponding to the first target vector.

In some embodiments, when the ink materials enter the corresponding pretreatment chambers, the control module may control a humidity module to humidify or dehumidify an interior of ink reservoirs to achieve the target humidity corresponding to each of the ink materials.

In some embodiments of the present disclosure, the processor can obtain a more accurate target humidity based on the ink material data of the ink materials and the ambient humidity through the second vector database related to the humidity, such that an internal humidity of each of the pretreatment chambers where the ink materials are located can meet the printing requirements, thereby improving the printing quality.

In some embodiments, the processor may perform the light modulation on each of the ink materials in each of the pretreatment chambers based on the first preset program.

In some embodiments, the first preset program may further include: for each pf the ink materials, determining, based on a photosensitive property demand of each of the ink materials and the extrusion speed, a target light parameter when the ink material is in the pretreatment chamber. The target light parameter may include a target light type and a target light intensity corresponding to the target light type.

More descriptions regarding the photosensitive property demand may be found in the related descriptions of FIG. 4.

The target light parameter refers to a light parameter required in the pretreatment chamber for the ink material to meet the printing requirements.

The target light type refers to a light type required in the pretreatment chamber for the ink material to meet the printing requirements. The light type may include visible light, infrared light, and ultraviolet light.

The target light intensity refers to an internal light intensity that needs to be achieved in the pretreatment chamber for the ink material to meet the printing requirements.

In some embodiments, for each of the ink materials, the processor may determine, based on the photosensitive property demand of the ink material, a candidate light parameter when the ink material is in the pretreatment chamber by querying a preset relationship table, the candidate light parameter including the target light type and a candidate light intensity corresponding to the corresponding; in response to determining that the extrusion speed of the ink material is less than a third preset threshold, increase the candidate light intensity by a preset intensity adjustment to determine the target light parameter.

In some embodiments, the preset relationship table may include the photosensitive property demands of the plurality of the ink materials and the corresponding candidate light parameters. The preset relationship table may be set by those skilled in the art based on experience.

The third preset threshold refers to a minimum extrusion speed at which a turbulence is formed in the trough as the ink material is extruded. In some embodiments, the third preset threshold may be negatively correlated with the viscosity of the ink material. The smaller the viscosity of the ink material, the better the fluidity of the ink material. When the extrusion speed is low, the turbulence may occur in the trough. In this case, the third preset threshold may be appropriately increased, and the light intensity may be appropriately increased to increase the viscosity of the ink material.

In some embodiments, the preset intensity adjustment and the third preset threshold may be set by those skilled in the art based on experience.

In some embodiments of the present disclosure, the light parameter of each of the pretreatment chambers is determined according to the photosensitive property demand of each of the ink materials and the extrusion speed, and the viscosity of each of the ink materials is reasonably adjusted using the light parameter to adjust the fluidity of each of the ink materials, such that the processor can perform printing at a relatively low extrusion speed, thereby ensuring the printing quality while avoiding the turbulence during extrusion.

In some embodiments, an oxygen content sensor and an inert gas sensor may monitor an oxygen concentration and an inert gas concentration in each of the pretreatment chambers in real time, and transmit gas concentration data to the control module. The control module may open or close a gas inlet and a gas outlet to control a type and a flow rate of the gas, such that a gas environment inside each of the pretreatment chambers reaches a gas concentration required by each of the ink materials.

In some embodiments of the present disclosure, the temperature, the humidity, the light, and the gas environment in each of the pretreatment chambers are controlled accurately in real time through the first preset program, so as to make each of the ink materials in each of the pretreatment chambers meet the printing requirements, thereby improving the printing quality and printing efficiency.

In 120, the plurality of ink materials after the pretreatment may flow into corresponding troughs from the pretreatment chambers, and an applied gas pressure and an applied gas duration for each trough may be set based on the ink materials required for printing a flexible semiconductor and a thickness of each of the ink materials, the pressure being provided by a pump.

In some embodiments, the processor may determine the applied gas pressure and the applied gas duration for each of the troughs based on a second preset program according to on the ink materials required for printing the flexible semiconductor and the printing thickness of each of the ink materials.

The second preset program refers to a program that determines the applied gas pressure and the applied gas duration required for each of the troughs. The second preset program may be pre-stored in the processor.

In some embodiments, the second preset program may include: determining, based on the printing thickness of the ink material in each of the troughs, an ink demand of the ink material; for each of the troughs: determining, based on the ink demand, the ink material data of the ink material, and the ambient temperature, the applied gas pressure required for the trough through a gas pressure prediction model; and regulating an extrusion gas pressure in the printing process according to the applied gas pressure required for each trough and the ink demand.

The printing thickness refers to a thickness of each of the ink materials in a finished print product, such as 0.5 cm. The finished print product is a finished product of a flexible semiconductor to be printed. In some embodiments, the printing thickness of the ink material may be obtained based on a structural dimensional parameter of the flexible semiconductor to be printed. The structural dimensional parameter of the flexible semiconductor to be printed may be pre-uploaded to the control module by those skilled in the art.

The ink demand refers to a volume of the ink material needed to complete the printing.

In some embodiments, the processor may obtain the volume of the required ink material, i.e., the ink demand, by calculating, based on the printing thickness of each of the ink materials and the structural dimensional parameter of the flexible semiconductor to be printed.

The gas pressure prediction model refers to a model for predicting the applied gas pressure that needs to be applied in the trough. In some embodiments, the gas pressure prediction model may be a machine learning model, such as a neural network model, etc.

In some embodiments, an input pf the gas pressure prediction model may include the ink demand of the ink material in the trough, the ink material data, and the ambient temperature, and an output pf the gas pressure prediction model may include the applied gas pressure.

More descriptions regarding the applied gas pressure, the ink material data, and the ambient temperature may be found in the related descriptions of FIG. 4 and the operation 110 of FIG. 1.

In some embodiments, the gas pressure prediction model may be obtained by training based on a large number of training samples with training labels. The training samples may include sample ink demands of sample ink materials in sample troughs, ample ink material data, and sample ambient temperatures. One of the sample troughs may correspond to one of the training samples. The training labels corresponding to the training samples may include actual applied gas pressures required for the sample troughs.

In some embodiments, the training samples may be obtained based on the historical data. For example, the training sample may include historical ink demands of historical ink materials in historical troughs in the historical prints, the historical ink material data, and the historical ambient temperatures.

In some embodiments, the processor may cluster the training samples to form a plurality of sample clusters; for each of the sample clusters, determine a matching degree of an actual finished print product corresponding to each of the training samples in the cluster with a preset printing template, and determine an actual applied gas pressure corresponding to a training sample with the highest matching degree as the training label for all training samples in the cluster.

The matching degree between the actual finished print product and the preset printing template may be obtained by the processor through a 3D model similarity calculation process. The 3D model similarity calculation process may include an iterative closest point algorithm (ICP), a trained deep convolutional neural network (e.g., PointNet), etc.

In some embodiments, the processor may input the training samples into an initial gas pressure prediction model, construct a loss function based on an applied gas pressure output from the initial gas pressure prediction model and the training labels, and iteratively update the initial gas pressure prediction model based on the loss function. When a preset condition is satisfied, the training of the initial gas pressure prediction model may be completed, and a trained gas pressure prediction model may be obtained. The preset condition may be that the loss function converges, a count of iterations reaches a preset threshold, etc. The manner of iterative updating may include but not limited to the manner of gradient descent, etc.

In some embodiments, the processor may determine a maximum value of the applied gas pressures required by all the troughs, and control the pump to continuously provide a pressure at the maximum value of the applied gas pressures until all the ink materials in all the troughs achieve completion of extrusion. During the process of extruding the ink materials from the troughs, the processor may adjust the opening degree of each proportional valve disposed at the connection of each of the troughs and the pump according to the applied gas pressure required by each trough and a corresponding extrusion time period.

The completion of extrusion means that a current ink usage reaches the required ink demand for printing, i.e., there is no need to continue extruding from the trough for the current print. The ink usage refers to an amount of the ink material that is extruded from the trough for the current print.

In some embodiments, the processor may determine whether the ink material achieves completion of extrusion based on the ink demand and the ink height. For example, the processor may determine an ink usage in the trough based on a drop of the ink height and a dimensional parameter of the trough; and when the ink usage is equal to the ink demand, the processor may determine the ink material achieves completion of extrusion.

The extrusion time period is a time period between a start of extrusion and the completion of extrusion of the ink material in each of the troughs. In some embodiments, the extrusion time period may be set by those skilled in the art based on experience.

In some embodiments, for each of the troughs, the processor may adjust the opening degree of the proportional valve corresponding to the trough based on the applied gas pressure required for the trough and the extrusion time period. For example, if the applied gas pressure required for the trough is equal to the maximum value of the applied gas pressures required for all the troughs, the processor may open the proportional valve fully (100%) for the extrusion time period corresponding to the trough. As another example, if the applied gas pressure required for the trough is less than the maximum value of the applied gas pressures required for all the troughs, the processor may open the proportional valve and adjust the opening degree of the proportional valve in the extrusion time period corresponding to the trough such that the applied gas pressure introduced into the trough reaches the applied gas pressure required for the trough.

In some embodiments, the processor may determine an applied gas duration for each of the troughs based on the ink demand for the ink material in each of the troughs, the ink material data, and the applied gas pressure; dividing the printing process into a plurality of printing phases based on the applied gas duration; and for each of the printing phases, determine the instruction gas pressure in the printing phase based on the ink demand and the applied gas pressure in each trough during the printing phase.

The applied gas duration refers to a duration required from the start of extrusion to the completion of extrusion of the ink material in each trough. That is, the applied gas duration is duration of the extrusion time period.

In some embodiments, the processor may determine, based on the applied gas pressure and the ink material data, the extrusion speed of the ink material in each of the troughs through a Poiseuille flow model; and determine a ratio of the ink demand for the ink material in each of the troughs to the extrusion speed as the applied gas duration of the trough.

More descriptions regarding determining the extrusion speed through the Poiseuille flow model may be found in the related descriptions of the operation 110.

In some embodiments, the processor may set the extrusion time period of the trough based on the applied gas duration of the trough, and perform phase division at a time point when a count of troughs in the extrusion changes to divide the printing process into a plurality of printing phases. For example, if a trough A and a trough B are provided, and corresponding extrusion time periods are 01:00-02:00 and 01:30-02:30, respectively, the count of troughs in the extrusion at 01:30 changes from 1 trough to 2 troughs (i.e., from the trough A to the trough A and the trough B), and the count of troughs in the extrusion at 02:00 changes from 2 troughs to 1 trough (i.e., from the trough A and the trough B to the trough B), then the phase division is performed at 01:30 and 02:00 to obtain a printing phase 1 (01:00-01:30), involving the trough A, a printing phase 2 (01:30-02:00), involving the trough A and the trough B, and a printing phase 3 (02:00-02:30), involving the trough B.

In some embodiments, for each printing phase, the processor may determine the maximum value of the applied gas pressures required for all the troughs involved in the printing phase, and control the pump to continuously provide the gas pressure at the maximum value of the applied gas pressures; and during the extrusion of the ink material from each of the troughs involved in the printing phase, the processor may adjust the opening degree of the proportional valve provided at the connection of each of the troughs and the pump according to the required applied gas pressure and the corresponding extrusion time period of each of the troughs.

In some embodiments of the present disclosure, the applied gas duration of the gas introduced into each of the troughs is determined based on the ink material data, the ink demand, and the applied gas pressure of each of the ink materials, the printing process is divided into the plurality of printing phases according to the applied gas duration of each of the troughs, and the extrusion gas pressure in the printing phase is determined according to the ink demand and the applied gas pressure in each of the troughs, such that the processor can dynamically regulate the extrusion gas pressure in different phases of each of the troughs, and continuous introduction of high pressure gas during the printing process can be avoided, thereby saving corresponding power resources.

In some embodiments of the present disclosure, the applied gas pressure is determined through the gas pressure prediction model based on the ink demand for each of the troughs, the ink material data, and the ambient temperature, and the extrusion gas pressure in the printing process is regulated based on the applied gas pressure and the ink demand for each of the troughs. The applied gas pressure in each of the troughs can be accurately set using the machine learning model, thereby realizing efficient and accurate regulation of the extrusion gas pressure in the printing process.

In some embodiments, an emptying time point for each of the troughs may be determined at a preset cycle based on the ink height of the ink material, the ink demand, and the applied gas duration for each of the troughs. For each of the printing phases, the opening degree of the proportional valve of each trough during the printing phase may be adjusted according to the emptying time point of each trough.

In some embodiments, the preset cycle may be set by those skilled in the art based on experience, such as 30 s.

More descriptions regarding the ink height may be found in the related descriptions of FIG. 2.

The emptying time point refers to a time point when the ink material in the trough is completely emptied.

In some embodiments, the processor may determine a total amount of ink in the trough based on the ink height in the trough and the dimensional parameter of the trough. In response to determining that the total amount of ink is greater than the ink demand, it means that there is ink material remaining in the trough after the completion of extrusion, i.e., no empty trough occurs. In response to determining that the total amount of ink is not greater than the ink demand, it means that there is no ink material remaining in the trough after the completion of extrusion, i.e., the empty trough occurs. If the empty trough occurs, the processor may determine a time point corresponding to a time point after the applied gas duration from a start time point of the extrusion time period as the emptying time point.

In some embodiments, the processor may close the proportional valve of the trough at the emptying time point corresponding to the trough, i.e., adjusting the opening degree of the proportional valve to 0%.

In some embodiments of the present disclosure, when the ink material in the trough achieves the completion of extrusion, if the extrusion gas is continuously introduced, the extrusion gas may directly impact the printed material through the printhead, resulting in damage to the printed material. By determining the emptying time point of each trough, and closing the proportional valve disposed at the connection between the trough and the pump at the emptying time point, deformation or damage of the material caused by the extrusion gas directly impacting the printed material through the printhead due to use-up of the ink material in the trough can be avoided.

In some embodiments, in response to determining that a pressure fluctuation of the extrusion gas exceeding a first preset threshold is detected, the processor may control the proportional valve to close.

The pressure fluctuation of the extrusion gas refers to a difference between a pressure value acquired by the pressure sensor in the trough at a current sampling time point and a pressure value acquired at a previous sampling time point.

The first preset threshold is a minimum critical threshold for pressure fluctuation within the trough that causes deformation or damage to the printed material. In some embodiments, the first preset threshold may be set by those skilled person based on experience.

In some embodiments of the present disclosure, excessive fluctuation of the pressure in the trough during the printing process may affect the uniformity or continuity of the ink material extruded from the printhead, which in turn affects the quality of the print product or even damages the printed product. Therefore, when the excessive fluctuation of the pressure is detected, the proportional valve may be closed to cut off feeding from the trough to the printhead, so as to protect the print product from damage in time.

In some embodiments of the present disclosure, with application of the second preset program, the applied gas pressure and the applied gas duration during the printing process can be accurately controlled, thereby improving the printing efficiency and the printing effect, protecting the finished print product from damage and saving energy cost.

In 130, the corresponding ink materials may be controlled to be sequentially extruded by gases in the corresponding troughs, intertwined and injected into interfaces, stacked to form a stacked layer structure at the interfaces, and printed by printheads connected with the interfaces based on material types, printing thicknesses, and a layer sequence of different layer structures of the flexible semiconductor at a position to be printed.

In some embodiments, the processor may obtain a relationship between the printing thickness of each of the ink materials in the flexible semiconductor and the applied gas pressure and the applied gas duration based on a third preset program.

The third preset program refers to a program that represents the relationship between the printing thickness of each of the ink materials in the flexible semiconductor and the applied gas pressure and the applied gas duration. In some embodiments, the third preset program may be pre-stored in the processor.

More descriptions regarding the applied gas pressure and the applied gas duration may be found in the related descriptions of the operation 120.

In some embodiments, the relationship between the printing thickness of each of the ink materials in the flexible semiconductor and the applied gas pressure and the applied gas duration may be expressed as follows:

$$D^2 \times th_1 = (\pi \times D^4) \times t_1 \times d^2 / (128 \times \eta \times L) \times (\Delta P / \varepsilon \times K)$$

where D denotes the diameter of each of the printheads, $th_1$ denotes the printing thickness, $t_1$ denotes the applied gas duration corresponding to the ink material used, d denotes a diameter of each of the interfaces, $\eta$ denotes the viscosity of the ink material, L denotes a length of each of the printheads, $\Delta P$ denotes the applied gas pressure, $\varepsilon$ denotes a porosity of the ink material, and K denotes a permeability of the ink material.

D, $th_1$, d, L, ε, and K may be obtained and uploaded by those skilled in the art in advance, and η may be preset by the those skilled in the art based on experience.

In some embodiments of the present disclosure, the applied gas pressure and the applied gas duration required in each of the troughs can be accurately obtained through the third preset program according to the printing thickness of each of the ink materials in the flexible semiconductor, thereby improving the printing quality and efficiency while saving energy.

The beneficial effects of some embodiments of the present disclosure include the following content. The ink materials are pre-treated before entering the troughs, and the control module adjusts the environmental parameters of the pre-treatment chambers, including the temperature, the humidity, the light intensity, and the gas environment, through the feedback of the plurality of modules, such that each of the ink materials is in the optimal printing state to achieve the optimal printing effect. The simultaneous printing of the ink materials of different viscosities and fluidities is realized by setting up the plurality of multi-channel troughs and controlling the applied gas pressure and the applied gas duration, which improves the printing speed and shortens the printing time. The ink materials are interwoven and injected into the solenoid valve printhead and the electrostatic spinning printhead, and stacked to form the stacked material structure at the ends of the printheads, which can realize direct printing of the sandwich structure of the semiconductor device, and complete integrated printing of the packaging and the device.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure, or feature described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures, or features may be combined as suitable in one or more embodiments of the present disclosure.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various parts described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

In some embodiments, numbers describing the number of ingredients and attributes are used. It should be understood that such numbers used for the description of the embodiments use the modifier "about", "approximately", or "substantially" in some examples. Unless otherwise stated, "about", "approximately", or "substantially" indicates that the number is allowed to vary by ±20%. Correspondingly, in some embodiments, the numerical parameters used in the description and claims are approximate values, and the approximate values may be changed according to the required features of individual embodiments. In some embodiments, the numerical parameters should consider the prescribed effective digits and adopt the method of general digit retention. Although the numerical ranges and parameters used to confirm the breadth of the range in some embodiments of the present disclosure are approximate values, in specific embodiments, settings of such numerical values are as accurate as possible within a feasible range.

For each patent, patent application, patent application publication, or other materials cited in the present disclosure, such as articles, books, specifications, publications, documents, or the like, the entire contents of which are hereby incorporated into the present disclosure as a reference. The application history documents that are inconsistent or conflict with the content of the present disclosure are excluded, and the documents that restrict the broadest scope of the claims of the present disclosure (currently or later attached to the present disclosure) are also excluded. It should be noted that if there is any inconsistency or conflict between the description, definition, and/or use of terms in the auxiliary materials of the present disclosure and the content of the present disclosure, the description, definition, and/or use of terms in the present disclosure is subject to the present disclosure.

Finally, it should be understood that the embodiments described in the present disclosure are only used to illustrate the principles of the embodiments of the present disclosure. Other variations may also fall within the scope of the present disclosure. Therefore, as an example and not a limitation, alternative configurations of the embodiments of the present disclosure may be regarded as consistent with the teaching of the present disclosure. Accordingly, the embodiments of the present disclosure are not limited to the embodiments introduced and described in the present disclosure explicitly.

What is claimed is:

1. A control method for printing and discharging of a flexible semiconductor 3D additive material, applied to printing of the flexible semiconductor 3D additive material, comprising:
   a plurality of ink materials entering corresponding pretreatment chambers for pretreatment of temperature, humidity, light, and gas environment modulation in the pretreatment chambers;

the plurality of ink materials after the pretreatment flowing into corresponding troughs from the pretreatment chambers, and setting an applied gas pressure and an applied gas duration for each trough based on the ink materials required for printing a flexible semiconductor and a thickness of each of the ink materials, the pressure being provided by a pump;

controlling, based on material types, printing thicknesses, and a layer sequence of different layer structures of the flexible semiconductor at a position to be printed, the corresponding ink materials to be sequentially extruded by gases in the corresponding troughs, intertwined and injected into interfaces, stacked to form a stacked layer structure at the interfaces, and printed by printheads connected with the interfaces; wherein a relationship between the printing thickness of each of the ink materials in the flexible semiconductor and the applied gas pressure and the applied gas duration is as follows:

$$D^2 \times th_1 = (\pi \times D^4) \times t_1 \times d^2/(128 \times \eta \times L) \times (\Delta P/\varepsilon \times K)$$

wherein D denotes a diameter of each of the printheads, $th_1$ denotes the printing thickness, $t_1$ denotes the applied gas duration corresponding to each of the ink materials, d denotes a diameter of each of the interfaces, $\eta$ denotes a viscosity of each of the ink materials, L denotes a length of each of the printheads, $\Delta P$ denotes the applied gas pressure, $\varepsilon$ denotes a porosity of each of the ink materials, and K denotes a permeability of each of the ink materials;

the control method further comprises a system for printing and discharging, wherein the system for printing and discharging includes: the pump, the pretreatment chambers, the troughs, the interfaces, and the printheads;

the printheads include a solenoid valve printhead and an electrostatic spinning printhead;

one or more troughs are provided, and upper portions of the one or more troughs are connected with the pretreatment chambers, respectively;

the one or more troughs are connected with the pump;

ends of part of the one or more troughs are connected with the solenoid valve printhead through one of the interfaces, and ends of the remaining troughs of the one or more troughs are connected with the electrostatic spinning printhead through another of the interfaces;

the printhead includes the solenoid valve printhead and the electrostatic spinning printhead, troughs A, B, and C are connected the solenoid valve printhead for printing an active layer of the flexible semiconductor, troughs D, E, and F are connected with the electrostatic spinning printhead for printing an electrode, a dielectric layer, and an insulating layer of the flexible semiconductor, respectively;

an opening degree of each proportional valve is sequentially controlled based on a stacking order of different layers of the flexible semiconductor to be printed, and the ink materials in the one or more troughs are intertwined to flow into the interfaces through conduits disposed at the ends of the one or more troughs, and are injected into the printheads through the interfaces.

2. The control method of claim 1, wherein each of the pretreatment chambers is provided with a control module, and a temperature module, a humidity module, a light module, and a gas environment module which are electrically connected with the control module;

the temperature module is configured to adjust a temperature of the ink material in each of the pretreatment chambers, the humidity module is configured to adjust an internal humidity of each of the pretreatment chambers, the light module is configured to provide different light sources for the pretreatment chambers, and the gas environment module is configured to provide a gas environment for each of the pretreatment chambers.

3. The control method of claim 2, wherein the temperature module includes a heating device, a refrigeration device, and a temperature sensor which are disposed inside each of the pretreatment chambers and electrically connected with the control module; the temperature sensor senses an internal temperature of each of the pretreatment chambers in real time and transmits temperature data to the control module, and the control module activates the heating device or the refrigeration device according to a temperature property of each of the ink materials to realize real-time temperature modulation.

4. The control method of claim 2, wherein the humidity module includes a humidifying device, a dehumidifying device, and a humidity sensor which are electrically connected with the control module, the humidity sensor is disposed inside each of the pretreatment chambers, and the humidifying device and the dehumidifying device are disposed outside each of the pretreatment chambers and communicated with the inside of each of the pretreatment chambers; the humidity sensor monitors the internal humidity of each of the pretreatment chambers in real time and transmits the internal humidity to the control module, and the control module activates the humidifying device or the dehumidifying device according to a humidity demand of each of the ink materials to realize humidity modulation.

5. The control method of claim 2, wherein the light module includes a visible light lamp, an ultraviolet light lamp, an infrared light lamp, and a light intensity sensor, an infrared light sensor, an ultraviolet light sensor which are disposed inside each of the pretreatment chambers and electrically connected with the control module;

the light intensity sensor, the infrared light sensor, and the ultraviolet light sensor respectively monitor a visible light intensity, an infrared light intensity, and an ultraviolet light intensity in each of the pretreatment chambers in real time, and transmit the visible light intensity, the infrared light intensity, and the ultraviolet light intensity to the control module, the control module modulates the visible light intensity, the infrared light intensity, and the ultraviolet light intensity according to a photosensitive property demand of each of the ink materials.

6. The control method of claim 2, wherein the gas environment module includes a gas inlet, a gas outlet, an oxygen content sensor, and an inert gas sensor, the gas inlet and the gas outlet are disposed on left and right sides of a top of each of the pretreatment chambers, respectively, and the oxygen content sensor and the inert gas sensor are disposed inside each of the pretreatment chambers and are electrically connected with the control module;

the oxygen content sensor and the inert gas sensor monitor a gas concentration in each of the pretreatment chambers in real time, and transmit the gas concentration to the control module, and the control module controls a type and a flow rate of an introduced gas by opening or closing at least one of the gas inlet or the gas outlet according to a gas concentration required by each of the ink materials to control the gas environment.

7. The control method of claim 1, wherein a trough temperature sensor and a heating element are disposed inside each of the troughs, a refrigeration element is disposed outside each of the troughs, the trough temperature sensor, the heating element, and the refrigeration element are electrically connected with the control module, and the trough temperature sensor senses the a temperature of each of the troughs, wherein the heating element heats each of the troughs when a required printing temperature of each of the ink materials is greater than a room temperature, and the refrigeration element cools each of the troughs when the required printing temperature of each of the ink materials is less than the room temperature.

8. The control method of claim 1, wherein a wall of each of the pretreatment chambers is composed of an inner layer and an outer layer bonded together, the inner layer being a plastic layer, and the outer layer being a metal film.

9. The control method of claim 1, wherein a printhead temperature sensor is disposed inside each of the printheads and electrically connected with the control module to feed back a printhead temperature in real time.

* * * * *